United States Patent [19]

Oana et al.

[11] Patent Number: 6,146,929
[45] Date of Patent: Nov. 14, 2000

[54] METHOD FOR MANUFACTURING SEMICONDUCTOR DEVICE USING MULTIPLE STEPS CONTINUOUSLY WITHOUT EXPOSING SUBSTRATE TO THE ATMOSPHERE

[75] Inventors: Yasuhisa Oana, Yokohama; Kaichi Fukuda; Takayoshi Dohi, both of Fukaya, all of Japan

[73] Assignee: Kabushiki Kaisha Toshiba, Kawasaki, Japan

[21] Appl. No.: 09/347,862

[22] Filed: Jul. 9, 1999

[30] Foreign Application Priority Data

| Jul. 9, 1998 | [JP] | Japan | 10-193514 |
| Sep. 18, 1998 | [JP] | Japan | 10-263811 |
| Feb. 19, 1999 | [JP] | Japan | 11-040889 |

[51] Int. Cl.$^7$ .................................................. H01L 21/00
[52] U.S. Cl. .................. 438/151; 438/909; 438/149; 438/150; 438/166; 156/643
[58] Field of Search .................. 458/149, 150, 458/151, 166, 30; 156/643

[56] References Cited

U.S. PATENT DOCUMENTS

| 4,624,737 | 11/1986 | Shimbo | 156/643 |
| 5,543,356 | 8/1996 | Murakami et al. | 437/152 |
| 5,609,737 | 3/1997 | Fukui et al. | 204/192.12 |
| 5,755,938 | 5/1998 | Fukui et al. | 204/298.23 |
| 5,804,471 | 9/1998 | Yamazaki et al. | 438/154 |
| 5,902,704 | 5/1999 | Schoenborn et al. | 430/5 |
| 6,004,831 | 12/1999 | Yamazaki et al. | 438/30 |
| 6,074,917 | 6/2000 | Chang et al. | 438/261 |

*Primary Examiner*—Richard Booth
*Assistant Examiner*—Viktor Simkovic
*Attorney, Agent, or Firm*—Pillsbury Madison & Sutro LLP

[57] ABSTRACT

In manufacturing a thin-film transistor on a glass substrate, a first thin film consisting of an amorphous silicon thin film is formed on the glass substrate, and a second thin film is formed on the first thin film. Then, this second thin film is etched to form a mask pattern. A dopant ion is doped into the first thin film through the mask pattern to form a source region and a drain region. The process of forming the mask pattern and the process of forming the source and drain regions are carried out continuously without exposing the substrate to the atmosphere.

19 Claims, 4 Drawing Sheets

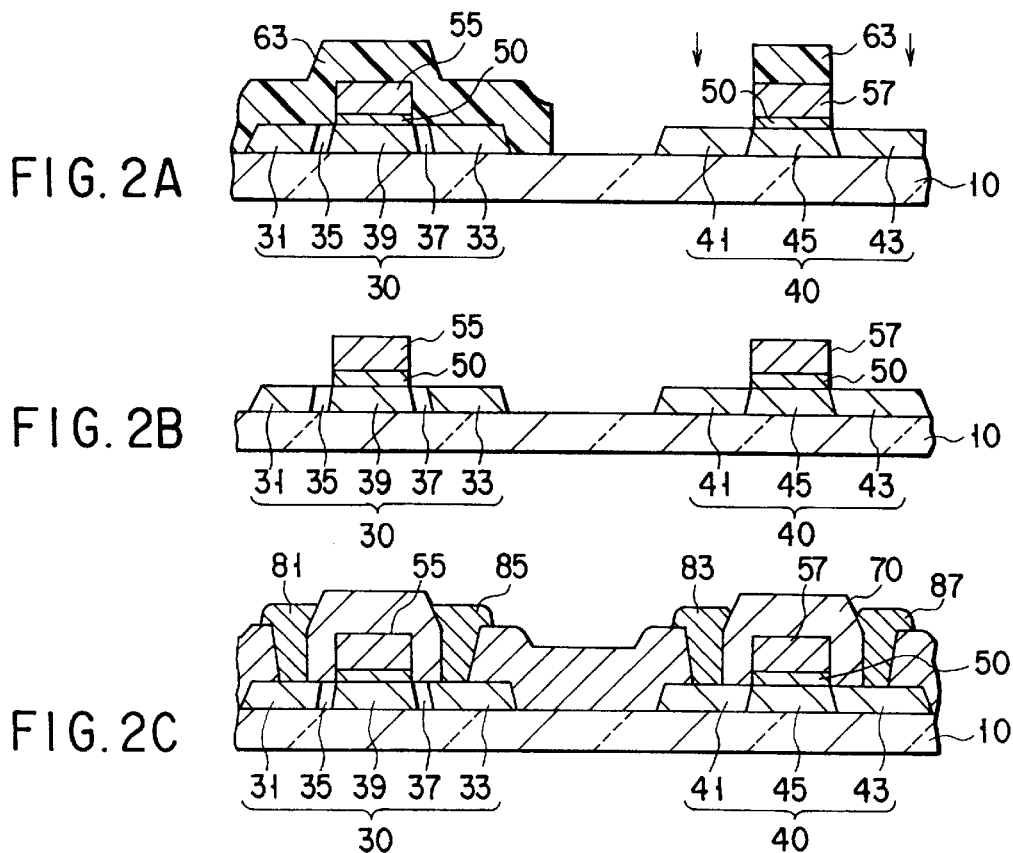
FIG. 2A
FIG. 2B
FIG. 2C
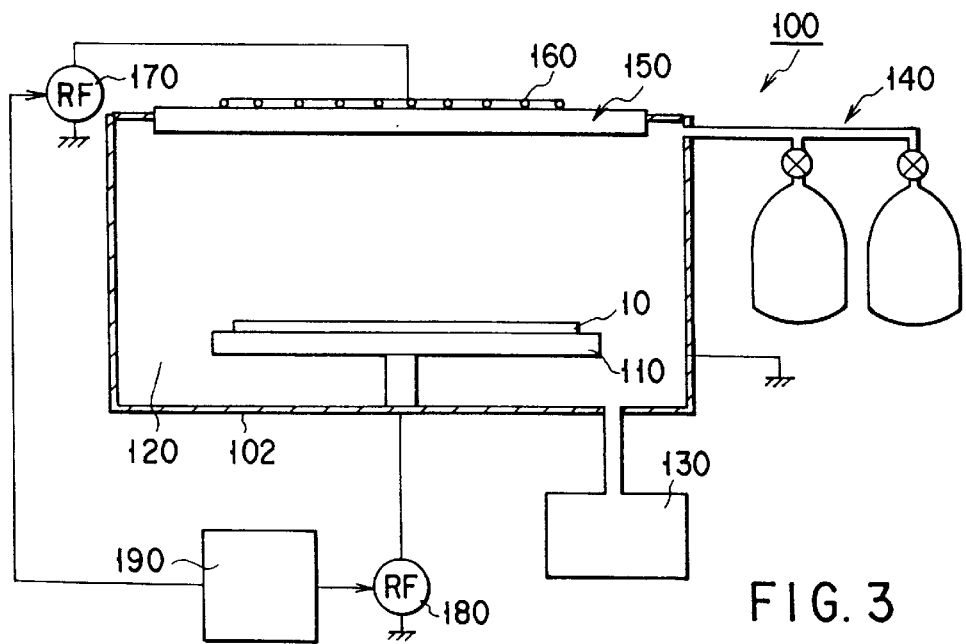
FIG. 3

METHOD FOR MANUFACTURING SEMICONDUCTOR DEVICE USING MULTIPLE STEPS CONTINUOUSLY WITHOUT EXPOSING SUBSTRATE TO THE ATMOSPHERE

BACKGROUND OF THE INVENTION

The present invention relates to a method of manufacturing a semiconductor device such as a thin-film transistor or the like to be formed on an insulating substrate, and an apparatus for manufacturing this semiconductor device.

A technique for manufacturing a semiconductor device such as a thin-film transistor (hereinafter to be referred to as a TFT) or the like on an insulating substrate such as glass, quartz or others has been utilized in various kinds of fields such as for application to an active matrix type liquid crystal display unit and others, and attention has been focused on this technique.

In a conventional TFT, amorphous silicon (hereinafter to be referred to as a-Si:H) or the like is uses for an active layer and source and drain electrodes are disposed on this a-Si:H through an ohmic contact layer like n+a-Si:H or others. In recent years, an attempt has been made to use polycrystalline silicon (p-Si) for an active layer in order to have improved mobility to secure sufficient operation speed.

One example of a method of manufacturing this kind of thin-film transistor will be explained below.

For example, a thin film of an amorphous silicon is deposited on a transparent glass substrate to have a desired film thickness by plasma CVD (Chemical Vapor Deposition) method or the like, and this film layer is crystallized by annealing such as ELA (Excimer Laser Annealing) or the like, thereby to form a polycrystalline silicon (p-Si) thin film. Then, after pattering this p-Si thin film, a gate insulating film is deposited on this, and further, a metal film such as an Al alloy or the like is deposited.

A resist pattern is disposed on this metal film, and the metal film is patterned by RIE (Reactive Ion Etching) or the like based on the resist pattern, thereby to form gate electrodes. Then, after removing the resist by ashing, a dopant ion is doped into the p-Si thin film by using the gate electrodes as a mask so as to form source areas and drain areas.

Thereafter, the substrate is heated at 500° C. to activate the doped ion. Then, an inter-layer insulating film is deposited on this, and contact holes are formed by wet etching the gate insulating film and the inter-layer insulating film on the source and drain areas respectively. Then, a drain electrode electrically connected to the drain area and a source electrode electrically connected to the source area are formed respectively to complete a thin-film transistor.

According to the above-described method of manufacturing a thin-film transistor, the respective etching-patterning process, the ion doping process and the activation process are carried out by individual processing units. Accordingly, it requires many expensive individual units and it also takes a long time, for manufacturing a semiconductor device represented by the thin-film transistor. Thus, it has been difficult to sufficiently lower the manufacturing cost.

It has also become clear that unfinished products are stagnated between a plurality of processing units, and this undesirable stagnant brings about adhesion of fine particles and adsorption of water in the atmosphere onto and into the surface of the elements area of the substrate, which causes a reduction in production yield.

BRIEF SUMMARY OF THE INVENTION

The present invention has been contrived to solve the above-described technical problems, and its object is to provide a method and an apparatus for manufacturing a semiconductor device, capable of reducing the processing time and the number of expensive processing units required for the manufacturing of the semiconductor device.

Further, it is also an object of the invention to provide a method and an apparatus for manufacturing a semiconductor device, capable of reducing an undesirable stagnation of unfinished products between manufacturing processes, thereby achieving high productivity.

In order to achieve the above objects, according to one aspect of the present invention, there is provided a method of manufacturing a semiconductor device, comprising the steps of:

forming a first thin film consisting of an amorphous silicon thin film on an insulating substrate; forming a second thin film on the first thin film; etching the second thin film to form a mask pattern; and doping an impurity ion into the first thin film through the mask pattern;

wherein the mask pattern forming process and the ion doping process are carried out continuously without exposing the insulating substrate to the atmosphere.

Further, according to another aspect of the invention, there is provided a method of manufacturing a semiconductor device, comprising the steps of: forming a first thin film consisting of an amorphous silicon thin film on an insulating substrate; forming a second thin film on the first thin film; etching the second thin film to form a mask pattern; and doping an impurity ion into the first thin film through the mask pattern;

wherein the mask pattern forming process and the ion doping process are carried out continuously without exposing the insulating substrate to the atmosphere.

Further, according to still another aspect of the invention, there is provided a method of manufacturing a semiconductor device, comprising the steps of: forming a first thin film consisting of an amorphous silicon film on an insulating substrate; forming a second thin film on the first thin film; forming a resist pattern on the second thin film;

forming a mask pattern by etching the second thin film based on the resist pattern; doping an impurity ion into the first thin film through the mask pattern; and removing the resist pattern after the mask pattern forming process or after the ion doping process, wherein the mask pattern forming process, the ion doping process and the removing process are carried out continuously without exposing the insulating substrate to the atmosphere.

Further, according to still another aspect of the invention, there is provided a method of manufacturing a semiconductor device, comprising the steps of: forming a first thin film consisting of an amorphous silicon film on an insulating substrate; forming a second thin film on the first thin film; etching the second thin film to form a first mask pattern; forming a source area and a drain area by doping an impurity ion into the first thin film through the first mask pattern; forming a second mask pattern by side-etching the first mask pattern following the ion doping process; and forming an electric field relaxation area with lower impurity density than that of the source area and the drain area, by doping an impurity ion into the first thin film through the second mask pattern, wherein the first and second mask pattern forming processes, the source and drain areas forming process, and the electric field relaxation area forming process are carried out continuously without exposing the insulating substrate to the atmosphere.

Further, according to still another aspect of the invention, there is provided a method of manufacturing a semiconductor device, comprising the steps of: forming a first thin film consisting of an amorphous silicon film on an insulating substrate; forming a second thin film on the first thin film; forming a mask pattern by etching the second thin film; and forming an ohmic contact area by doping an impurity ion into the first thin film through the mask pattern, wherein the mask pattern forming process and the ion doping process are carried out continuously without exposing the insulating substrate to the atmosphere.

Further, according to still another aspect of the invention, there is provided a method of manufacturing a semiconductor device, comprising the steps of: forming a first thin film consisting of an amorphous silicon film on an insulating substrate; forming a second thin film on the first thin film; forming a resist pattern on the second thin film; forming a mask pattern by etching the second thin film based on the resist pattern; forming an ohmic contact area by implanting an impurity ion into the first thin film through the mask pattern; and removing the resist pattern after the mask pattern forming process or after the ion doping process, wherein the mask pattern forming process, the ion doping process, and the removing process are carried out continuously without exposing the insulating substrate to the atmosphere.

According to the above-described method of manufacturing a semiconductor device, as the patterning process and the ion doping process are carried out continuously without exposing the insulating substrate to the atmosphere, it is possible to substantially reduce the manufacturing time. Particularly, it is possible to reduce the number of expensive processing units by carrying out those processes within the same chamber. Thus, investments in the processing units can be reduced substantially and a space occupied by each processing unit can also be reduced. Furthermore, as there is no unnecessary stagnation of unfinished products in the middle of the processes, it is possible to prevent the adhesion of fine particles and adsorption of water in the atmosphere onto and into the surface of the element area of the substrate. As a result, productivity can be improved as compared with the prior-art technique.

On the other hand, according to still another aspect of the invention, there is provided a manufacturing apparatus for manufacturing a semiconductor device, comprising: a processing chamber internally equipped with a susceptor for supporting a substrate to be processed; exhaust means connected to the processing chamber, for exhausting the processing chamber in vacuum; gas supply means connected to the processing chamber, for supplying a reaction gas to the processing chamber; a first power source for applying a predetermined voltage to the substrate to be processed; activating means including a second power source, for activating the reaction gas introduced into the processing chamber; and a control section for selectively carrying out one of an ion doping process for doping an ion into the substrate to be processed or an etching process, by controlling the first and second power sources and the reaction gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate rate presently preferred embodiments of the invention, and together with the general description given above and the detailed description of the preferred embodiments given below, serve to explain the principles of the invention.

FIGS. 2A to 2C are cross-sectional views for explaining manufacturing processes of the thin-film transistor following the process shown in FIG. 1G;

FIG. 3 is a cross-sectional view schematically showing a plasma processing unit relating to the embodiment of the invention, that is used in the above-described manufacturing processes;

DETAILED DESCRIPTION OF THE INVENTION

A method of manufacturing a semiconductor device relating to an embodiment of the present invention will be explained in detail with reference to the drawings, by taking an example of manufacturing thin-film transistors of a CMOS structure on an array substrate for a TFT liquid crystal display panel.

Figure 1A:
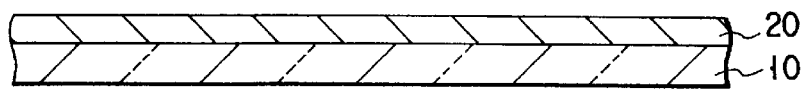
FIGS. 1A to 1G are cross-sectional views for explaining manufacturing processes of a thin-film transistor relating to an embodiment of the present invention.

At first, as shown in FIG. 1A, a transparent glass substrate 10 is prepared having external dimensions of 500 mm×600 mm with a thickness of 0.7 mm. On a main surface of the glass substrate 10, there is deposited by the plasma CVD method an amorphous silicon (a-Si:H) thin film 20 having a thickness of 50 nm, with the substrate set at a temperature of 400° C. Thereafter, this a-Si:H thin film 20 is dehydrogenated in an nitrogen atmosphere to have low hydrogen density in order to prevent a hydrogen abrasion in a crystallization process to be described later.

Figure 1B:
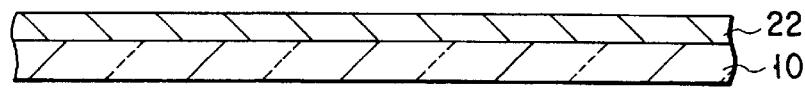

Then, in order to control a threshold value Vth of the thin-film transistor, a boron (B) ion is implanted into the a-Si:H thin film 20. Thereafter, as shown in FIG. 1B, the a-Si:H thin film 20 is crystallized by ELA (Excimer Laser Annealing) to obtain a polycrystalline silicon (p-Si) thin film 22. For the ELA, a long beam of 0.3×400 mm is used. By scanning this beam in a pitch of 15 $\mu$m, the a-Si:H thin film is crystallized.

Figure 1C:
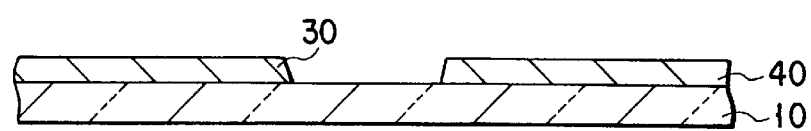

Next, as shown in FIG. 1C, the p-Si thin film 22 is patterned into island-shaped p-Si thin films 30 and 40 by CDE (Chemical Dry Etching) using $CF_4$ and $O_2$ gases and by using a desired resist pattern as a mask.

Figure 1D:
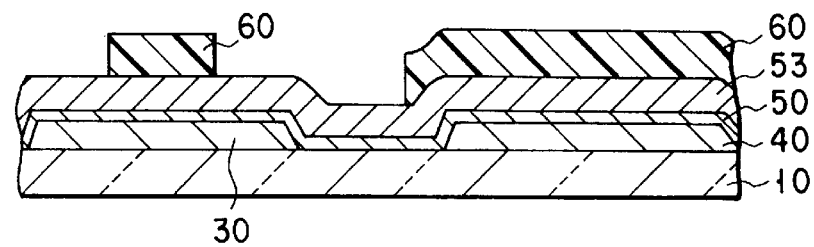

Thereafter, as shown in FIG. 1D, a TEOS film 50 is deposited as a gate insulating film on the p-Si thin films 30 and 40 by the plasma CVD method. Further, an Al—Nd alloy film 53 having a thickness of 300 nm is formed on the substrate by sputtering. Further, a resist is coated on this, exposed and developed to form a resist pattern 60. This resist pattern 60 sufficiently covers the p-Si thin film 40 and is disposed at a predetermined position on the p-Si thin film 30.

The substrate 10 after having the above processing is carried into a plasma processing unit 100 as shown in FIG. 3, and subsequent manufacturing processes are carried out in this unit. The plasma processing unit 100 will be explained.

As shown in FIG. 3, the plasma processing unit 100 is equipped with a housing 102 defining a vacuum chamber 120, a susceptor 110 disposed in the vacuum chamber 120, for supporting the substrate 10, a pump 130 connected to the vacuum chamber 120, for exhausting the chamber 120 into vacuum, a gas supply system 140 connected to the vacuum chamber 120, for supplying a desired gas into the chamber 120, a dielectric 150 structured by ceramic or the like and disposed airtight on an upper surface of the vacuum chamber 120 facing the susceptor 110, an antenna 160 arranged on the dielectric 150, for applying a high frequency, a first high-frequency source 170 for applying a high frequency to the antenna 160, a second high-frequency source 180 connected to the susceptor 110, for applying a high frequency, and a control section 190 for controlling the first and second high-frequency sources 170 and 180.

Figure 1E:
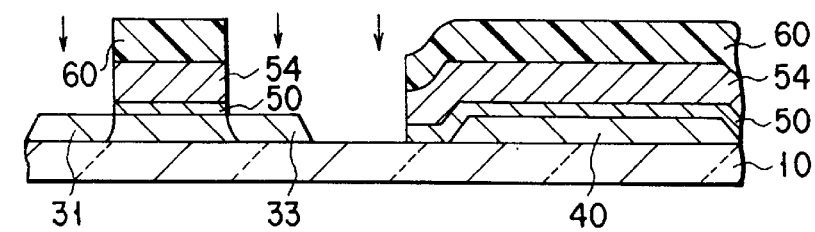

The substrate 10 is disposed on the susceptor 110 of the plasma processing unit 100, and the inside of the vacuum chamber 120 is maintained in vacuum at 50 to 100 mTorr. Then, a high frequency of 13.56 MHz is applied to the antenna 160 at 1000 W from the first high-frequency source 170. At the same time, $Cl_2$ and $BCl_3$ gases are supplied by 500 sccm and 500 sccm respectively into the vacuum chamber 120 from the gas supply system 140, and a plasma discharging is carried out. After the plasma discharging has been stabilized, a high frequency of 6.0 MHz is applied to the susceptor 110 at 200 W from the second high-frequency source 180 based on the control of the control section 190. Then, as shown in FIG. 1E, the $Cl_2$ and $BCl_3$ gases ionized or radicalized by the plasma discharging are drawn to the substrate 10 side by self-bias of the substrate 10 at about −10V. In the RIE mode, the Al—Nd alloy film 53 is patterned almost vertically based on the resist pattern 60, and a first pattern 54 is thus formed.

Further, in continuation, the TEOS film 50 on the lower layer of the first pattern 54 is patterned along the shape of the first pattern 54. This is due to a reduction in bias at the time of an ion doping to be described later.

Thereafter, a gas remaining within the vacuum chamber 120 is exhausted, and a high frequency of 13.56 MHz is applied to the antenna 160 at 2000 W from the first high frequency source 170. At the same time, $PH_3$ gas is supplied by 20 sccm into the vacuum chamber from the gas supply source 140, thereby to carry out a plasma discharging. After the plasma discharging has been stabilized, a high frequency of 2 MHz is applied to the susceptor 110 at 1500 W from the second high-frequency source 180 based on the control of the control section 190.

The $PH_3$ gas is ionized or radicalized by the plasma discharging and a dopant ion ($PH_x^+$) is drawn to the substrate 10 side by self-bias of the substrate at about −200V, and a radical ($PH_3^*$) is diffused into the P—Si thin film 30, thus an ion doping is achieved by using the first pattern 54 as a mask. If the self-bias is lower than 1 kv, a diffusion of a radical is mainly generated. In this case, a dose quantity of phosphorus (P) is controlled to $1\times10^{15}$ ions/cm$^2$ by controlling processing time. Accordingly, a source area 31 and a drain area 31 are formed within the p-Si thin film 30 as shown in FIG. 1E.

Figure 1F:
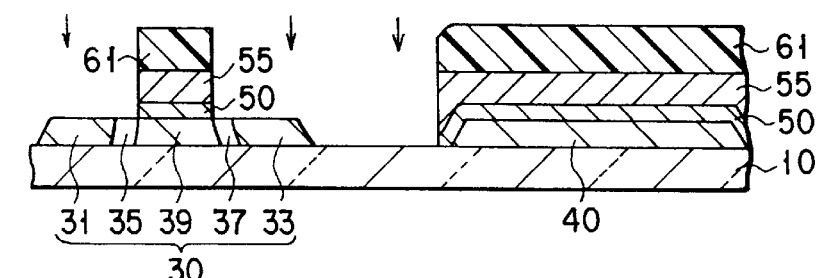

Subsequently, as shown in FIG. 1F, after a gas remaining within the vacuum chamber 120 has been exhausted, a high frequency of 13.56 MHz is applied to the antenna 160 at 2000 W from the first high frequency source 170, and $CF_4$ is supplied by 50 sccm and $O_2$ is supplied by 950 ccm into the vacuum chamber from the gas supply system 140. Thus, the resist mask 60 is side-etched by about 0.5 μm.

Then, a high frequency of 13.56 MHz is applied to the antenna 160 at 1000 W from the first high frequency source 170, and the gas supply and gas flow quantities from the gas supply system 140 into the vacuum chamber 120 are changed to $Cl_2$ by 500 sccm and $BCl_3$ by 500 sccm, thereby to carry out a plasma discharging. After the plasma discharging has been stabilized, a high frequency of 6 MHz is applied to the susceptor 110 at 200 W from the second high-frequency source 180 based on the control of the control section 190. Thus, the first pattern 54 is etched based on the side-etched resist mask 61, thereby to form a second pattern 55.

In this case, the second pattern 55 on the p-Si thin film 30 coincides with a final shape of the gate electrode. Although not described in detail yet, following the forming of the second pattern 55, the TEOS film 50 is patterned into a shape along the second pattern 55 due a reduction in bias at the time of an ion doping to be described later.

Thereafter, a gas remaining within the vacuum chamber 120 is exhausted, and a high frequency of 13.56 MHz is applied to the antenna 160 at 500 W from the first high frequency source 170. At the same time, $PH_3$ is supplied by 10 sccm into the vacuum chamber from the gas supply source 140, thereby to carry out a plasma discharging. After the plasma discharging has been stabilized, a high frequency of 2 MHz is applied to the susceptor 110 at 2000 W from the second high-frequency source 180 based on the control of the control section 190. The $PH_3$ gas is ionized or radicalized by the plasma discharging and a dopant ion ($PH_x^+$) is drawn to the substrate 10 side by self-bias of the substrate at about −300V, and a radical ($PH_3^*$) is diffused into the P—Si thin film 30, thus an ion doping is achieved by using the second pattern 55 as a mask.

In this case, a dose quantity of phosphorus (P) is controlled to $1\times10^{13}$ ions/cm$^2$ by controlling time in a similar manner to the above. With this arrangement, LDD regions 35 and 37 and a channel region 39 sandwiched by the LDD regions 35 and 37 are formed within the p-Si thin film 30.

Figure 1G:
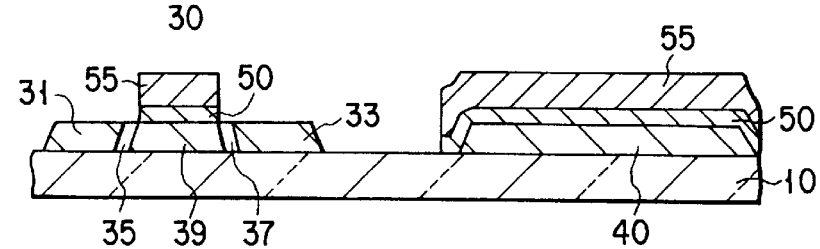

Subsequently, as shown in FIG. 1G, a gas remaining within the vacuum chamber 120 is exhausted, and a high frequency of 13.56 MHz is applied to the antenna 160 at 2000 W from the first high frequency source 170. At the same time, $CF_4$ is supplied by 50 sccm and $O_2$ is supplied by 950 sccm into the vacuum chamber 120 from the gas supply source 140, thereby to carry out a plasma discharging. In this case, the self-bias of the substrate 10 is approximately zero, and the resist mask 61 is removed by ashing in the CDE mode based on the $CF_4$ and $O_2$ gases ionized or radicalized by the plasma discharging.

Next, as shown in FIG. 2A, a resist is coated on the substrate 10, which is then exposed and developed to form a resist pattern 63. This resist pattern 63 sufficiently covers the p-Si thin film 30 and is disposed at a predetermined position on the p-Si thin film 40.

The substrate 10 is disposed on the susceptor 110 of the plasma processing unit 100, and the inside of the vacuum chamber 120 is maintained in vacuum at 10 mTorr. Then, a high frequency of 13.56 MHz is applied to the antenna 160 at 1000 W from the first high-frequency source 170. At the same time, $Cl_2$ and $BCl_3$ are supplied by 500 sccm and 500 sccm respectively into the vacuum chamber 120 from the gas supply system 140, and a plasma discharging is carried out. After the plasma discharging has been stabilized, a high frequency of 6 MHz is applied to the susceptor 110 at 200 W from the second high-frequency source 180 based on the control of the control section 190.

As shown in FIG. 2A, the $Cl_2$ and $BCl_3$ gases ionized and radicalized by the plasma discharging are drawn rapidly to the substrate 10 side by self-bias of the substrate 10 at about −10V. In the RIE mode, the second pattern 55 formed by the Al—Nd alloy film on the p-Si thin film 40 is patterned almost vertically based on the resist pattern 63, and a third pattern 57 which coincides with a final shape of the gate electrode is formed.

Further, in continuation, the TEOS film 50 on the lower layer of the third pattern 57 is patterned along the shape of the third pattern 57. This is due to a reduction in bias at the time of an ion doping to be described later.

Thereafter, a gas remaining within the vacuum chamber 120 is exhausted, and a high frequency of 13.56 MHz is applied to the antenna 160 at 2000 W from the first high frequency source 170. At the same time, $B_2H_6$ is supplied by 20 sccm into the vacuum chamber from the gas supply source 140, thereby to carry out a plasma discharging. After the plasma discharging has been stabilized, a high frequency of 2 MHz is applied to the susceptor 110 at 1500 W from the second high-frequency source 180 based on the control of the control section 190.

The $B_2H_6$ gas is ionized or radicalized by the plasma discharging, a dopant ion ($B^2H_x^+$) is drawn to the substrate 10 side by self-bias of the substrate at around −200V, and a radical ($B_2H_6^*$) is diffused into the P—Si thin film 40, thus an ion doping is achieved with using the third pattern 57 as a mask.

In this case, a dose quantity of phosphorus (P) is controlled to $1 \times 10^{15}$ ions/cm$^2$ by controlling the processing time in a similar manner to the above. With this arrangement, a source region 41 and a drain region 43 and a channel region 45 sandwiched between the source and drain regions 41 and 43 are formed within the p-Si thin film 40.

Subsequently, as shown in FIG. 2B, a gas remaining within the vacuum chamber 120 is exhausted, and a high frequency of 13.56 MHz is applied to the antenna 160 at 2000 W from the first high frequency source 170. At the same time, $CF_4$ is supplied by 50 sccm and $O_2$ is supplied by 950 sccm into the vacuum chamber from the gas supply source 140, thereby to carry out a plasma discharging, and the plasma discharging is stabilized. In this case, the self-bias of the substrate 10 is approximately zero, and the resist mask 63 is removed by ashing in the CDE mode based on the $CF_4$ and $O_2$ gases ionized or radicalized by the plasma discharging.

Thereafter, the substrate 10 is heated at a temperature of about 500° C. to activate the implanted impurity. Then, as shown in FIG. 2C, a silicon nitride film (SiNx) is deposited as an inter-layer insulating film 70 by the plasma CVD method. Further, although not shown in the drawing, an ITO film, for example, is deposited as a transparent electrode by the sputtering method and is patterned in a predetermined shape. Then, contact holes are formed by wet etching on the inter-layer insulating film 70 on the source regions and drain regions 31, 33, 41 and 43, respectively.

Thereafter, an Al—Nd alloy film is deposited by sputtering, and is then patterned, so that there are formed drain electrodes 81 and 83 electrically connected to the drain regions 31 and 41 and source electrodes 85 and 87 electrically connected to the source regions 33 and 43.

Thereafter, a protection film may be formed by a silicon nitride film or others, if necessary, and this film is heated in a hydrogen atmosphere to stabilize element characteristics. By the above processes, the manufacturing of a thin-film transistor finishes.

According to the above-described manufacturing method, it is possible to execute continuously without exposing the insulating substrate to the atmosphere, the patterning of the Al—Nd alloy film 53, the ion doping of phosphorus (P) ion, the side-etching of the resist mask 60, the etching of the first pattern 54, the further ion doping of phosphorus (P) ion and the ashing of the resist mask 61 respectively. As a result, this method has made it possible to substantially reduce the processing time as compared with prior-arts.

Similarly, it is also possible to carry out continuously the patterning of the second pattern 55, the ion doping of boron (B) ion and the ashing of the resist mask 61, without exposing the insulating substrate to the atmosphere. Accordingly, this method has made it possible to substantially reduce the processing time.

Furthermore, as there is no undesirable congestion of unfinished products in the middle of the processes, it is possible to prevent adhesion of fine particles and adsorption of water in the atmosphere onto and into the surface of the element area of the substrate. This has made it possible to improve the productivity by 25% from that of the prior-art technique.

Further, the RIE process, the CDE process, the ion doping and the ashing process can be performed in one plasma processing unit, which has made it possible to reduce the number of individual processing units and to substantially cut down the investments in the units. Thus, the area required for the manufacturing apparatus can be greatly reduced.

In the above-described embodiment, in order to reduce bias in the ion doping process, the TEOS film 50 as a gate insulating film is removed after the patterning of the Al—Nd alloy film 53. However, it is not necessary to remove the TEOS film when sufficient bias can be applied during the ion doping process.

Further, in the above-described embodiment, boron (B) ion is doped into the channel region for controlling the threshold value Vth of the thin-film transistor. However, this channel doping and the patterning of the a-Si:H thin film 20 can be carried out continuously. Alternatively, the channel doping and the patterning can be carried out continuously after the crystallizing process of ELA and others.

Next, a method of manufacturing a semiconductor device according to the present invention will be explained in detail by taking an example of manufacturing an inverted-staggered type thin-film transistors as switching elements of each display pixel on an array substrate for a TFT liquid crystal display panel.

Figure 4A:
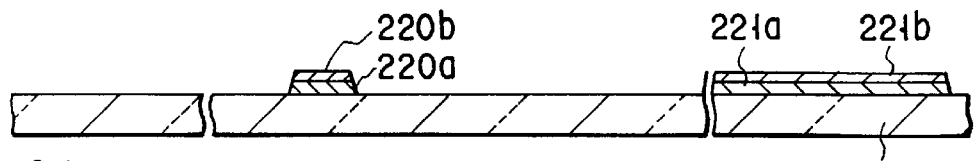
FIGS. 4A to 4F are cross-sectional views for explaining manufacturing processes of a thin-film transistor relating to another embodiment of the present invention.

At first, as shown in FIG. 4A, a transparent glass substrate 210 is prepared having external dimensions of 500 mm×600 mm with a thickness of 0.7 mm. On a main surface of this glass substrate, there are sequentially deposited by the sputtering method an Al—Nd alloy film having a thickness of 300 nm and an Mo film having a thickness of 50 nm. These films are patterned in a predetermined shape to form gate electrodes 220a and 220b, a scanning line (not shown)

integral with the gate electrodes, a slanting wiring section (not shown) drawn out from the scanning line, and OLB pad sections 221a and 221b connected to the slanting wiring section.

Figure 4B:
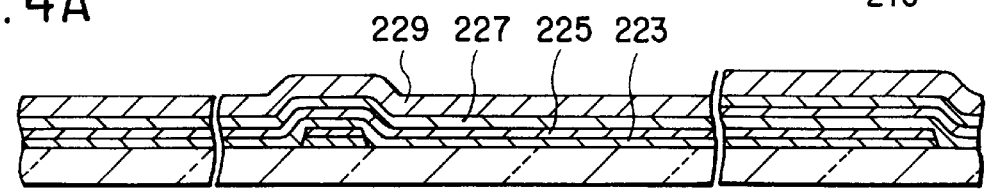

Then, as shown in FIG. 4B, there are sequentially deposited by the plasma CVD method, with the substrate set at a temperature of 300° C., a silicon oxide (SiOx) film 223 having a thickness of 150 nm as a gate insulating film, a silicon nitride (SiNx) film 225 having a thickness of 150 nm, an amorphous silicon (a-Si:H) thin film 227 having a thickness of 50 nm as a semiconductor for contributing as an active layer, and a further silicon nitride (SiNx) film 229 having a thickness of 300 nm. In this case, as a semiconductor layer, the a-Si:H thin film is used that is capable of securing a relatively uniform film quality over a wide area. However, various other kinds of semiconductor films may also be utilized such as a polycrystalline silicon thin film, etc.

Figure 4C:
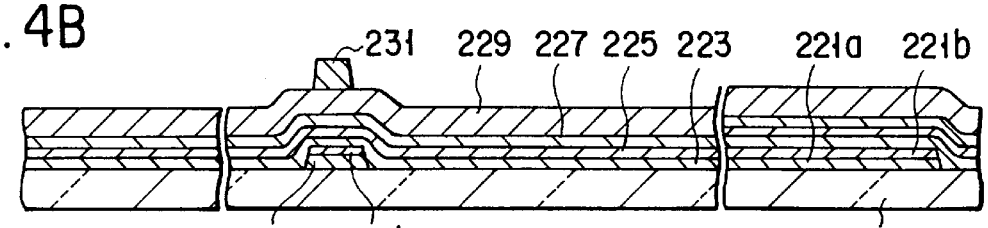

Next, a photo-resist is coated on the silicon nitride film 229, and an ultraviolet light is irradiated from a rear surface of the substrate 210 to the photo-resist by using the gate electrodes 220a and 220b as masks, thereby to selectively form a resist pattern 231 in an area corresponding to the gate electrodes 220a and 220b, as shown in FIG. 4C. In the present embodiment, the photo-resist is developed with a chemical liquid, but this may also be dry developed within a plasma processing unit 100 to be described later.

Then, this substrate 210 is carried into the plasma processing unit 100 shown in FIG. 3. In more detail, the substrate 210 is disposed on the susceptor 110 of the plasma processing unit 100, and the inside of the vacuum chamber 120 is maintained in vacuum at 50 to 100 mTorr. Then, a high frequency of 13.56 MHz is applied to the antenna 160 at 3000 W from the first high-frequency source 170. At the same time, $CHF_3$ and $O_2$ gases are supplied by 250 sccm and 50 sccm respectively into the vacuum chamber 120 from the gas supply system 140, and a plasma discharging is carried out. After the plasma discharging has been stabilized, a high frequency of 6.0 MHz is applied to the susceptor 110 at 500 W from the second high-frequency source 180 based on the control of the control section 190.

Figure 4D:
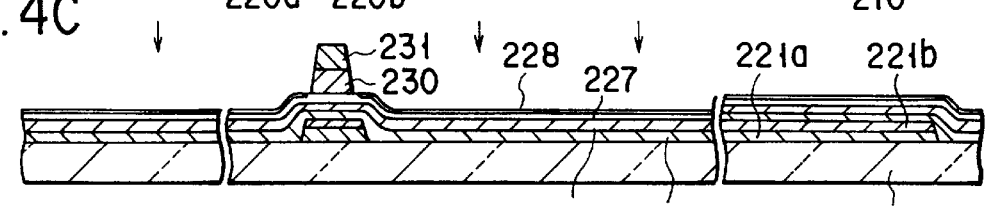

The $CHF_3$ and $O_2$ gases ionized or radicalized by the plasma discharging are drawn to the substrate 210 side by self-bias of the substrate 210 at about −10V. The SiNx film 229 is patterned almost vertically based on the resist pattern 231, and an etching protection film 230 is formed as shown in FIG. 4D.

Thereafter, a gas remaining within the vacuum chamber 120 is exhausted, and a high frequency of 13.56 MHz is applied to the antenna 160 at 2000 W from the first high frequency source 170. At the same time, $PH_3$ gas is supplied by 20 sccm into the vacuum chamber 120 from the gas supply source 140, thereby to carry out a plasma discharging. After the plasma discharging has been stabilized, a high frequency of 2 MHz is applied to the susceptor 110 at 1500 W from the second high-frequency source 180 based on the control of the control section 190.

The $PH_3$ gas is ionized or radicalized by the plasma discharging and a dopant ion ($PH_x^+$) is drawn to the substrate 210 side by self-bias of the substrate at about −200V, and a radical ($PH_3^*$) is diffused into the a-Si thin film 227, thus an ion doping is achieved.

In the present embodiment, a dose quantity of phosphorus (P) is controlled to $1\times10^{16}$ ions/cm$^2$ by controlling time. With this arrangement, an ohmic contact region 228 is formed within the a-Si thin film 227.

This ohmic contact region 228 may be formed over the whole width direction of the a-Si thin film 227 or may be formed on only layers near the surface layer. In this case, the ion doping quantity of P ion is set at $1\times10^{16}$ ions/cm$^2$ in the surface layer which is in the area of a thickness of 8 nm from the surface of the a-Si thin film 227. This is for the purpose of reducing a damage received by the a-Si thin film 227 by the ion doping.

Subsequently, a gas remaining within the vacuum chamber 120 is exhausted, and a high frequency of 13.56 MHz is applied to the antenna 160 at 2000 W from the first high frequency source 170. At the same time, $CF_4$ is supplied by 50 sccm and $O_2$ is supplied by 950 sccm into the vacuum chamber from the gas supply source 140, thereby to carry out a plasma discharging, and the plasma discharging is stabilized. In this case, the self-bias of the substrate 210 is approximately zero, and the resist mask 231 is removed by ashing in the CDE mode based on the $CF_4$ and $O_2$ gases ionized or radicalized by the plasma discharging.

Thereafter, the substrate 210 is mounted on other processing unit, and is heated for one hour at about 250° C. in a nitrogen atmosphere, thereby to activate an impurity.

Next, an Al—Nd alloy film having a film thickness of 300 nm is formed on the substrate 210 by sputtering. Further, a resist is coated on this, and the substrate 210 is exposed and developed to form a resist pattern. Then, the substrate 210 is disposed on the susceptor 110 of the plasma processing unit 100 in a similar manner to the above, and the inside of the vacuum chamber 120 is maintained in vacuum at 10 mTorr. Thereafter, a high frequency of 13.56 MHz is applied to the antenna 160 at 1000 W from the first high-frequency source 170. At the same time, $Cl_2$ and $BCl_3$ are supplied by 500 sccm and 500 sccm respectively into the vacuum chamber 120 from the gas supply system 140, and a plasma discharging is carried out. After the plasma discharging has been stabilized, a high frequency of 6.0 MHz is applied to the susceptor 110 at 200 W from the second high-frequency source 180 based on the control of the control section 190.

Figure 4E:
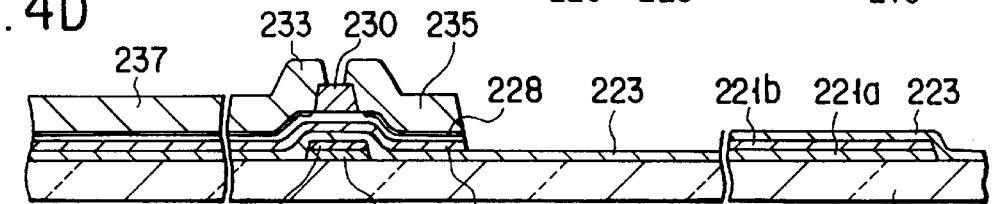

The $Cl_2$ and $BCl_3$ gases ionized and radicalized by the plasma discharging are drawn rapidly to the substrate 210 side by self-bias of the substrate 210 at about −10V. In the RIE mode, the Al—Nd alloy film is patterned almost vertically based on the resist pattern. With this arrangement, source and drain electrodes 233 and 235, a signal line (not shown) integral with the drain electrode 233, a slanting wiring section (not shown) drawn out from the signal line, and an OLB pad section 237 connected to the slanting wiring section are formed, as shown in FIG. 4E.

Subsequently, a gas remaining within the vacuum chamber 120 is exhausted, and a high frequency of 13.56 MHz is applied to the antenna 160 at 3000 W from the first high frequency source 170. At the same time, $CF_4$ gas is supplied by 50 sccm and $O_2$ gas is supplied by 950 sccm into the vacuum chamber from the gas supply source 140, thereby to carry out a plasma discharging, and the plasma discharging is stabilized. In this case, the self-bias of the substrate 210 is approximately zero. In the CDE mode based on the $CF_4$ and $O_2$ gases ionized or radicalized by the plasma discharging, the a-Si thin film 227 and the SiNx film 225 are selectively removed according to the source electrode 235, the drain electrode 233, the signal line, the slanting wiring section and the OLB pad section 237.

Further, a gas remaining within the vacuum chamber 120 is exhausted, and a high frequency of 13.56 MHz is applied to the antenna 160 at 2000 W from the first high frequency source 170. At the same time, $CF_4$ gas is supplied by 50 sccm and O$_2$ gas is supplied by 950 sccm into the vacuum chamber from the gas supply source 140, thereby to carry out a plasma discharging, and the plasma discharging is stabilized. In this case, the self-bias of the substrate 210 is approximately zero, and the resist mask is removed by ashing in the CDE mode based on the CF$_4$ and O$_2$ gases ionized or radicalized by the plasma discharging.

Figure 4F:
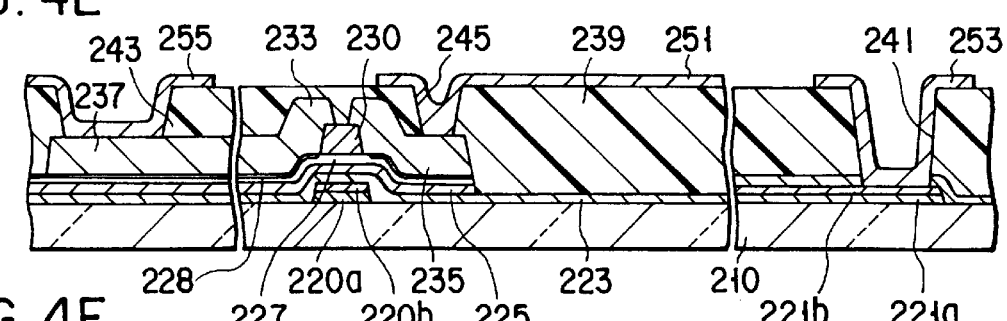

Next, as shown in FIG. 4F, an organic resin such as polyimide resin, photo-cure type resin and the like is coated on the whole surface of the substrate 210, and this is dried and hardened to form an inter-layer insulating film 239. This inter-layer insulating film 239 has a smoothening function in addition to the function of inter-layer insulation. Then, those portions of the inter-layer insulating film 239 which are on the OLB pad sections 221a and 221b, the interlayer insulating film 239 on the SiOx film 223, the inter-layer insulating film 239 on the OLB pad section 237, and the inter-layer insulating film 239 on the source electrode 235 are selectively removed to form contact holes 241, 243 and 245 respectively.

Then, a transparent conductive film such as ITO (Indium Tin Oxide) or the like is deposited on the substrate 210 by the sputtering method to pattern a desired shape, thereby to form a pixel electrode 251 and OLB pad electrodes 253 and 255 respectively. Thereafter, if necessary, a protection film may be formed by a nitride silicon film or the like according to the need.

As described above, according to the manufacturing method, it is also possible to execute continuously without exposing the insulating substrate to the atmosphere, the patterning of the SiNx film 229, the ion doping of phosphorus (P) ion, and the ashing of the resist mask 231 respectively. As a result, this method has made it possible to reduce the processing time as compared with the prior-art technique. Furthermore, as there is no undesirable congestion of unfinished products in the middle of the processes, it is possible to improve the productivity from that of the prior-art technique.

Further, the RIE process with a self bias of 50 to 150V (absolute value), the CDE process with a self bias of substantially 0V, the ion doping process with a self bias higher than 150V (absolute value), and the ashing process with a self bias of substantially 0V can be performed by one plasma processing unit, which has made it possible to greatly cut down the investments in the units and to substantially reduce the setting area required for the manufacturing apparatus.

In the above-described embodiment, explanation has been made of the TFT of an inverted staggered structure as an example. However, the TFT may also be a coplanar structure. Further, it is also possible to use Cl$_2$, BCl$_3$, CF$_4$, CHF$_3$, O$_2$ gases or other SF$_6$, C$_2$F$_6$ and C$_3$F$_8$ gases as an reaction gas.

In the above-described two embodiments, a most simple batch-system single chamber type has been explained as a plasma processing unit. However, it is needless to mention that it is also possible to use various other types such as a type for air-tight connecting a load lock chamber and an unload lock chamber to a vacuum chamber, a cluster type for airtight connecting a plurality of vacuum processing chambers to a common vacuum chamber, and the like. Further, in a multi-chamber type, each process may be processed in an exclusive chamber. More specifically, a most practical cluster type is a one having five processing chambers and two load lock chambers connected to a common vacuum chamber, the five processing chambers including an RIE chamber, two ion doping chambers (for boron and for phosphorus), a CDE chamber and an ashing chamber.

There will be explained below an embodiment of the present invention applied to a multi-chamber type plasma processing unit.

Figure 5:
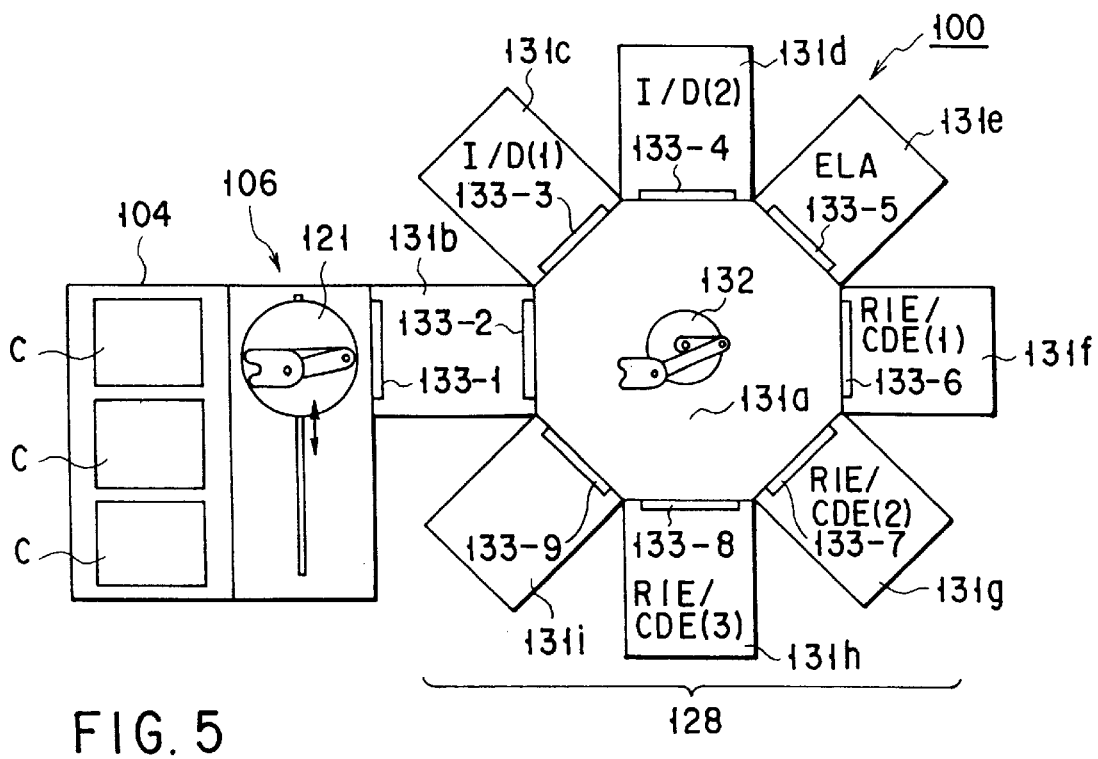
FIG. 5 is a plan view schematically showing a plasma processing unit relating to this embodiment of the invention.

As shown in FIG. 5, a plasma processing unit 100 is equipped with a cassette station 104 in which three cassettes C, each storing therein a plurality of substrates, can be disposed, a substrate processing section 128, and a carry-in and carry-out section 106 provided between the cassette section 104 and the substrate processing section 128. The carry-in and carry-out section 106 has a robot arm 121 for taking in and taking out each substrate accommodated in each cassette C of the cassette station 104 to and from the substrate processing section 128.

The substrate processing section 128 is equipped with an octagonal-shaped common chamber 131a formed in vacuum air-tight and having a carrying robot 132 substantially at its center, a load/unload chamber 131b disposed between the common chamber 131a and the section 106 for controlling a carry-in and carry-out of a substrate into and from within the substrate processing section 128, and seven processing chambers 131c, 131d, 131e, 131f, 131g, 131h and 131i, each connected air-tightly to the common chamber 131a.

Figure 6:
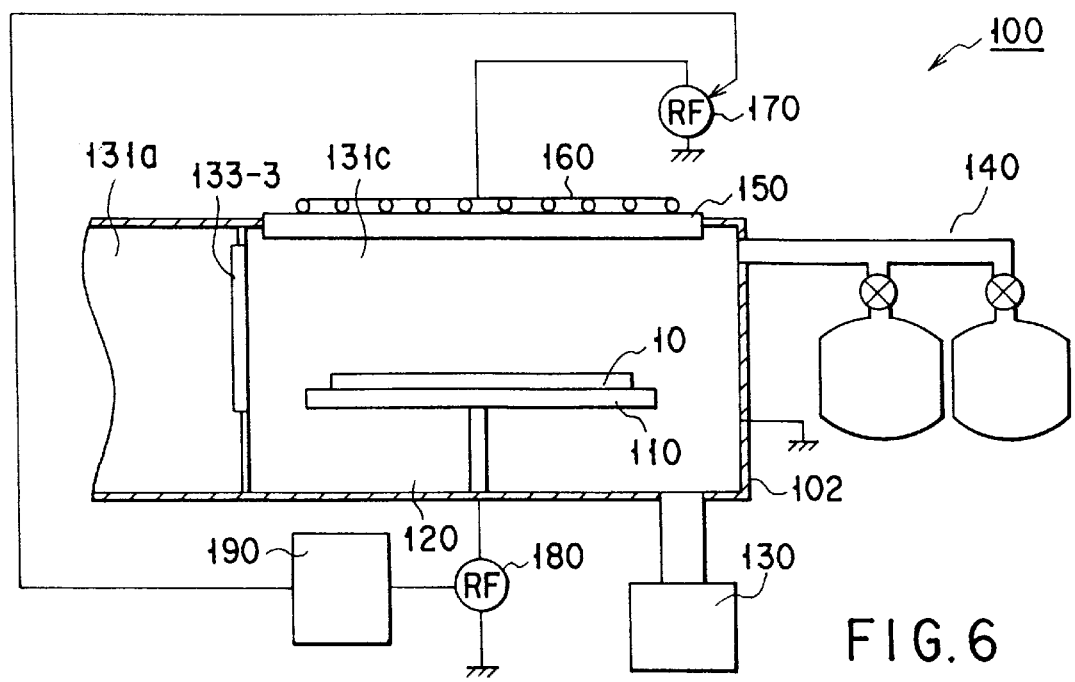
FIG. 6 is a cross-sectional view schematically showing one processing chamber of the plasma processing unit.

The processing chambers 131c, 131d, 131f, 131g and 131h are approximately in similar structures. Explanation will be made of the processing chamber 131c as a representative. As shown in FIG. 6, the processing chamber 131c includes a vacuum chamber 120 defined air-tightly within a housing 102, a susceptor 110 disposed within the vacuum chamber, for supporting a substrate 10, a pump 130 connected to the vacuum chamber 120, for maintaining the inside of the vacuum chamber in vacuum, a gas supply system 140 connected to the vacuum chamber, for supplying a desired gas into the chamber, a dielectric 150 structured by ceramic or the like and disposed air-tightly on an upper surface of the vacuum chamber 120 facing the susceptor 110, an antenna 160 disposed on the dielectric 150, for applying a high frequency, a first high-frequency source 170 for applying a high frequency to the antenna 160, a second high-frequency source 180 for applying a high frequency to the susceptor 110, and a control section 190 for controlling the first and second high-frequency sources 170 and 180. Other processing chambers 131d, 131f, 131g and 131h also have approximately the same structures. Explanation will be made by using the same symbols.

Next, there will be explained a method of manufacturing a thin-film transistor of a CMOS structure in the driving circuit integrated within an array substrate for a TFT-LCD by the plasma processing unit 100. Each manufacturing process will be explained with reference to the above-described FIGS. 1A to 1G and FIGS. 2A to 2C.

At first, as shown in FIG. 1A, a transparent glass substrate 10 is prepared having external dimensions of 500 mm×600 mm with a thickness of 0.7 mm. On a main surface of this glass substrate, there is deposited by the plasma CVD method an amorphous silicon (a-Si:H) thin film 20 having a thickness of 50 nm, with the substrate set at a temperature of 400° C. Thereafter, this a-Si:H thin film 20 is dehydrogenated in an nitrogen atmosphere to have low hydrogen density in order to prevent an abrasion in a crystallization to be described later.

Next, the cassette C storing the substrates 10 is disposed on the cassette station 104 of the plasma processing unit 100. Then, a gate valve 133-1 of the load lock chamber 131b at an atmospheric pressure is opened first. Then, a substrate 10 is guided out from the cassette C into the load lock chamber 131b with the robot arm 121. The gate valve 133-1 is closed, and then the load lock chamber 131b is decompressed to about 10 mTorr, for example, which is approximately the same pressure inside the common chamber 131a.

Then, a gate valve 133-2 is opened, and the substrate 10 is taken out from the load lock chamber 131b and is carried onto the susceptor 110 of the processing chamber 131c with the carrying robot 132. Thereafter, a gate valve 133-3 of the processing chamber 131c is closed, and the processing chamber 131c is maintained in air-tight.

In the processing chamber 131c, for controlling a threshold value Vth of the thin-film transistor, a high frequency of 13.56 MHz is applied to the antenna 160 at 2000 W from the first high-frequency source 170. At the same time, $B_2H_6$ gas is supplied to the processing chamber 131c by 20 sccm from the gas supply system 140 for carrying out a plasma discharging. After the plasma discharging has been stabilized, a high frequency of 2 MHz is applied to the susceptor 110 at 1500 W from the second high-frequency source 180 based on the control of the control section 190. The $B_2H_6$ gas is ionized or radicalized by the plasma discharging and is drawn to the substrate 10 side by self-bias of the substrate at around −200V, and boron (B) ion is doped into the a-Si:H thin film 20.

After a gas remaining in the processing chamber 131c is once exhausted, the gate valve 133-3 is opened, and the substrate 10 is carried out from the processing chamber 131c into the processing chamber 131e through the common chamber 131a with the carrying robot 132.

Then, a gate valve 133-5 of the processing chamber 131e is closed. In this processing chamber 131e, as shown in FIG. 1B, the a-Si:H thin film 20 is crystallized by ELA to obtain a polycrystalline silicon (p-Si) thin film 22. For the ELA, a long beam of 0.3×400 mm is used. By scanning this beam in a pitch of 15 $\mu$m, the a-Si:H thin film is crystallized.

Next, the gate valve 133-5 is opened, and the substrate 10 is guided to the load lock chamber 131b with the carrying robot 132. Then, the gate valve 133-2 is closed, and the load lock chamber 131b is set at an atmospheric pressure. Thereafter, the gate valve 133-1 is opened and the substrate 10 is carried out into the cassette C of the cassette station 104 with the robot arm 121.

The substrate 10 processed in this way is guided to other unit, and, as shown in FIG. 1C, the p-Si thin film 22 is patterned into island-shaped p-Si thin films 30 and 40 by CDE using $CF_4$ and $O_2$ gases and by using a desired resist pattern as a mask not shown.

Thereafter, as shown in FIG. 1D, a TEOS film 50 is deposited as a gate insulating film on the p-Si thin films 30 and 40 by the plasma CVD method. Further, an Al—Nd alloy film 53 having a film thickness of 300 nm is formed on the substrate by sputtering. Further, a resist is coated on this, exposed and developed to form a resist pattern 60. This resist pattern 60 sufficiently covers the p-Si thin film 40 and is disposed at a predetermined position on the p-Si thin film 30.

The substrate 10 is disposed again within the cassette C in the cassette station 104 of the plasma processing unit 100. Then, the gate valve 133-1 of the load lock chamber 131b at the atmospheric pressure is opened. Then, the substrate 10 is guided out from the cassette C into the load lock chamber 131b with the robot arm 121. The gate valve 133-1 is closed, and then the load lock chamber 131b is decompressed to about 10 mTorr, for example, which is approximately the same pressure inside the common chamber 131a.

Then, the gate valve 133-2 is opened, and the substrate 10 is taken out from within the load lock chamber 131b and is carried onto the susceptor 110 of the processing chamber 131f with the carrying robot 132. Thereafter, a gate valve 133-6 of the processing chamber 131f is closed, and the processing chamber 131f is maintained in air-tight.

The processing chamber 131f is maintained at a reduced pressure of 10 mTorr, for example. Then, a high frequency of 13.56 MHz is applied to the antenna 160 at 1000 W from the first high-frequency source 170. At the same time, $Cl_2$ and $BCl_3$ gases are supplied by 500 sccm and 500 sccm respectively into the processing chamber 131f from the gas supply system 140, and a plasma discharging is carried out. After the plasma discharging has been stabilized, a high frequency of 6 MHz is applied to the susceptor 110 at 200W from the second high-frequency source 180 based on the control of the control section 190. The $Cl_2$ and $BCl_3$ gases are ionized or radicalized by the plasma discharging and drawn to the substrate 10 side by self-bias of the substrate 10 at about −10V. In the RIE mode, the Al—Nd alloy film 53 is patterned almost vertically based on the resist pattern 60, and the first pattern 54 is formed in two parts as shown in FIG. 1E.

Further, in continuation, the TEOS film 50 on the lower layer of the first pattern 54 is patterned along the shape of the first pattern 54. This is due to a reduction in bias at the time of an ion doping to be described later.

After a gas remaining in the processing chamber 131f is once exhausted, the gate valve 133-6 is opened, and the substrate 10 is carried out from the processing chamber 131f into the processing chamber 131d through the common chamber 131a with the carrying robot 132. Then, a gate valve 133-4 is closed and the processing chamber 131d is maintained in air-tight. Then, a high frequency of 13.56 MHz is applied to the antenna 160 at 2000 W from the first high-frequency source 170 of the processing chamber 131d. At the same time, $PH_3$ gas is supplied by 20 sccm into the processing chamber 131d from the gas supply system 140, and a plasma discharging is carried out. After the plasma discharging has been stabilized, a high frequency of 2 MHz is applied to the susceptor 110 at 1500 W from the second high-frequency source 180 based on the control of the control section 190. The $PH_3$ gas is ionized or radicalized by the plasma discharging and drawn to the substrate 10 side by self-bias of the substrate 10 at about −200V, so that the ion doping is achieved.

In the present embodiment, a dose quantity of phosphorus (P) is controlled to $1\times10^{15}$ ions/cm$^2$ by controlling time. With this arrangement, a source region 31 and a drain region 31 are formed within the p-Si thin film 30.

Next, after a gas remaining in the processing chamber 131d is exhausted, the gate valve 133-4 is opened, and the substrate 10 is carried out from the processing chamber 131d into the processing chamber 131g through the common chamber 131a with the carrying robot 132. Then, a gate valve 133-7 is closed and the processing chamber 131g is maintained in air-tight. Thereafter, as shown in FIG. 1F, $CF_4$ gas is supplied by 50 sccm and $O_2$ gas is supplied by 950 ccm into the processing chamber 131g from the gas supply system 140, and the resist mask 60 is side-etched by about 0.5 $\mu$m. Subsequently, the gas supply and gas flow quantities from the gas supply system 140 into the processing chamber 131g are changed to $Cl_2$ by 500 sccm and $BCl_3$ by 500 sccm, and the first pattern 54 is etched based on the side-etched resist mask 61, thereby to form the second pattern 55. In this case, the second pattern 55 on the p-Si thin film 30 coincides with a final shape of the gate electrode. Although not described in detail yet, following the forming of the second pattern 55, the TEOS film 50 is patterned into a shape along the second pattern 55 due a reduction in bias at the time of an ion doping to be described later.

After a gas remaining in the processing chamber 131g is exhausted, the gate valve 133-7 is opened, and the substrate 10 is carried out from the processing chamber 131g into the processing chamber 131d through the common chamber 131a with the carrying robot 132. Then, the gate valve 133-4 is closed and the processing chamber 131d is maintained in air-tight. Then, a high frequency of 13.56 MHz is applied to the antenna 160 at 500 W from the first high-frequency source 170. At the same time, $PH_3$ gas is supplied by 10 sccm into the processing chamber 131d from the gas supply system 140, and a plasma discharging is carried out. After the plasma discharging has been stabilized, a high frequency of 2 MHz is applied to the susceptor 110 at 2000 W from the second high-frequency source 180 based on the control of the control section 190. The $PH_3$ gas is ionized or radicalized by the plasma discharging and drawn to the substrate 10 side by self-bias of the substrate 10 at about −200 V, so that the ion doping is achieved.

In the present embodiment, a dose quantity of phosphorus (P) is controlled to $1 \times 10^{13}$ ions/cm$^2$ by controlling the processing time in a similar manner to the one described above. With this arrangement, LDD regions 35 and 37 and a channel region 39 sandwiched by the LDD regions 35 and 37 are formed within the p-Si thin film 30.

Next, after a gas remaining in the processing chamber 131d is exhausted, the gate valve 133-4 is opened, and the substrate 10 is carried out from the processing chamber 131d into the processing chamber 131h through the common chamber 131a with the carrying robot 132. Then, a gate valve 133-8 is closed and the processing chamber 131g is maintained in air-tight. In this state, a high frequency of 13.56 MHz is applied to the antenna 160 at 2000 W from the first high frequency source 170. At the same time, $CF_4$ gas is supplied by 50 sccm and $O_2$ gas is supplied by 950 sccm into the processing chamber 131h from the gas supply source 140, thereby to carry out a plasma discharging. In this case, the self-bias of the substrate 10 is approximately zero, and the resist mask 61 is removed by ashing in the CDE mode based on the $CF_4$ and $O_2$ gases ionized or radicalized by the plasma discharging as shown in FIG. 1G.

Then, after a gas remaining within the processing chamber 131h is exhausted, the gate valve 133-8 is opened, and the substrate 10 is carried out to the load lock chamber 131b through the common chamber 131a with the carrying robot 132. Then, the gate valve 133-2 is closed, and the load lock chamber 131b is set at an atmospheric pressure. Thereafter, the gate valve 133-1 is opened and the substrate 10 is carried out into the cassette C of the cassette station 104 with the robot arm 121.

Next, as shown in FIG. 2A, a resist is coated on the substrate 10, which is then exposed and developed by other unit to form a resist pattern 63. This resist pattern 63 sufficiently covers the p-Si thin film 30 and is disposed at a predetermined position on the p-Si thin film 40.

The substrate 10 is disposed again within the cassette C in the cassette station 104 of the plasma processing unit 100. Then, the gate valve 133-1 of the load lock chamber 131b at the atmospheric pressure is opened. Then, the substrate 10 is guided out from the cassette C into the load lock chamber 131b with the robot arm 121. The gate valve 133-1 is closed, and then the load lock chamber 131b is decompressed to about 10 mTorr which is approximately the same pressure inside the common chamber 131a.

Then, the gate valve 133-2 is opened, and the substrate 10 is disposed onto the susceptor 110 of the processing chamber 131f through the common chamber 131a with the carrying robot 132. Then, the gate valve 133-6 is closed, and the processing chamber 131f is maintained in air-tight. In this state, the inside of the vacuum chamber 120 of the processing chamber 131f is maintained at a reduced pressure of 10 mTorr. Thereafter, a high frequency of 13.56 MHz is applied to the antenna 160 at 1000 W from the first high-frequency source 170. At the same time, $Cl_2$ and $BCl_3$ gases are supplied by 500 sccm and 500 sccm respectively into the processing chamber 131f from the gas supply system 140, and a plasma discharging is carried out. In this state, a high frequency of 6 MHz is applied to the susceptor at 200 W from the second high-frequency source 180 based on the control of the control section 190.

The $Cl_2$ and $BCl_3$ gases are ionized or radicalized by the plasma discharging and drawn to the substrate 10 side by self-bias of the substrate 10 at about −10V. In the RIE mode, the second pattern 55 consisting of the Al—Nd alloy film on the p-Si thin film 40 is patterned almost vertically based on the resist pattern 63, and a third pattern 57 coinciding with a final shape of the gate electrode is formed.

Further, in continuation, the TEOS film 50 on the lower layer of the third pattern 57 is patterned along the shape of the third pattern 57. This is due to a reduction in bias at the time of an ion doping to be described later.

Then, after a gas remaining within the vacuum chamber 120 of the processing chamber 131f is exhausted, the gate valve 133-6 is opened, and the substrate 10 is carried out from the processing chamber 131f into the processing chamber 131d with the carrying robot 132.

Next, the gate valve 133-4 is closed and the processing chamber 131d is maintained in air-tight. In this state, a high frequency of 13.56 MHz is applied to the antenna 160 at 2000 W from the first high-frequency source 170. At the same time, $PH_3$ is supplied by 20 sccm into the processing chamber 131d from the gas supply system 140, and a plasma discharging is carried out. After the plasma discharging has been stabilized, a high frequency of 2 MHz is applied to the susceptor 110 at 1500 W from the second high-frequency source 180 based on the control of the control section 190.

The $PH_3$ gas is ionized or radicalized by the plasma discharging and drawn to the substrate 10 side by self-bias of the substrate 10 at about −200V, so that the ion doping is achieved. In the present embodiment, a dose quantity of boron (B) is controlled to $1 \times 10^{15}$ ions/cm$^2$ by controlling time in a similar manner to the one described above. With this arrangement, source and drain areas 41 and 43 and a channel area 45 sandwiched between the source and drain areas 41 and 43 are formed within the p-Si thin film 40.

Next, after a gas remaining within the vacuum chamber 120 of the processing chamber 131d is exhausted, the gate valve 133-4 is opened, and the substrate 10 is carried out from the processing chamber 131d into the processing chamber 131h. Then, the gate valve 133-8 is closed. Then, a high frequency of 13.56 MHz is applied to the antenna 160 at 2000 W from the first high frequency source 170. At the same time, $CF_4$ gas is supplied by 50 sccm and $O_2$ gas is supplied by 950 sccm into the processing chamber 131h from the gas supply source 140, thereby to carry out a plasma discharging, and the plasma discharging is stabilized. In this case, the self-bias of the substrate 10 is approximately zero, and the resist mask 63 is removed by ashing in the CDE mode based on the $CF_4$ and $O_2$ gases ionized or radicalized by the plasma discharging as shown in FIG. 2B.

After a gas remaining within the processing chamber 131$h$ is exhausted, the gate valve 133-8 is opened, and the substrate 10 is carried out to the processing chamber 131$i$ through the common chamber 131$a$.

A gate valve 133-9 of the processing chamber 131$i$ is closed, and the substrate 10 is heat treated at a temperature of about 500° C., thereby to activate a doped ion.

Next, the gate valve 133-9 is opened, and the substrate 10 is guided to the load lock chamber 131$b$ through the common chamber 131$a$. The gate valve 133-2 is closed, and the load lock chamber 131$b$ is set at an atmospheric pressure. Thereafter, the gate valve 133-1 is opened and the substrate 10 is carried out into the cassette C.

Then, a silicon nitride film (SiNx) is deposited as an inter-layer insulating film 70 by the plasma CVD method. Further, although not shown in the drawing, an ITO film, for example, is deposited as a transparent electrode by the sputtering method and is patterned in a predetermined shape. Then, contact holes are formed by wet etching in the inter-layer insulating film 70 on the source and drain regions 31, 33, 41 and 43 respectively.

Thereafter, as shown in FIG. 2C, an Al—Nd alloy film is deposited by sputtering, and is then patterned, so that there are formed drain electrodes 81 and 83 electrically connected to the drain regions 31 and 41 and source electrodes 85 and 87 electrically connected to the source regions.

Lastly, if necessary, a protection film may be formed by a silicon nitride film or the like, and this film is heated in a hydrogen atmosphere to stabilize element characteristics.

According to the plasma processing unit having the above-described structure, it is possible to carry out continuously without exposing the insulating substrate to the atmosphere, the patterning of the Al—Nd alloy film 53, the ion doping of phosphorus (P) ion, the side-etching of the resist mask 60, the etching of the first pattern 54, the ion doping of phosphorus (P) ion and the ashing of the resist mask 61 respectively. As a result, this plasma processing unit has made it possible to reduce the processing time as compared with the prior-art technique.

Similarly, it is also possible to carry out continuously the patterning of the second pattern 55, the ion doping of boron (B) ion and the ashing of the resist mask 61, without exposing the insulating substrate to the atmosphere. Accordingly, this plasma processing unit has made it possible to further reduce the processing time. Furthermore, as there is no undesirable congestion of unfinished products in the middle of the processes, the productivity can be improved by 25% from that of the prior-art technique.

Further, the manufacturing apparatus can function as the RIE unit, the CDE unit, the ion doping unit and the ashing unit, it is possible to substantially cut down the investments in the units. This has also made it possible to reduce the area required for the manufacturing apparatus.

Further, according to the present embodiment, when it is necessary to carry out maintenance work in the processing chamber 131$c$, for example, the processing chamber 131$d$ or the processing chamber 131$f$, 131$g$ or 131$h$, each having approximately the same process, can be used for ion doping by controlling a type of gas and power to be input. Therefore, the operating rate is not lost substantially.

In the present embodiment, the processing chambers 131$c$, 131$d$, 131$f$, 131$g$ and 131$h$ are used discriminatively such that the processing chambers 131$c$ and 131$d$ are used for ion doping and the processing chambers 131$f$, 131$g$ and 131$h$ are used for etching. This is for the purposes of simplifying the piping to each of the processing chambers 131$c$, 131$d$, 131$f$, 131$g$ and 131$h$ and preventing mixing-in of impurities due to remaining gases or the like.

However, the present invention is not limited to this embodiment. It is also possible to carry out ion doping and etching continuously in each processing chamber by controlling a type of gas and power to be input respectively.

Further, in the present embodiment, the processing chamber 131$e$ for the ELA processing and the processing chamber 131$i$ for activating impurities are also connected to the plasma processing unit 100. However, it is also possible to connect a CVD processing chamber for forming a semiconductor film or an insulating film to the plasma processing unit 100.

Further, in the above-described plurality of embodiments, the antenna 160 of the plasma processing unit is disposed on the upper surface of the dielectric 150. Alternately, the antenna 160 may be disposed at a lower side of the dielectric within the vacuum chamber.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a first thin film consisting of a non-single crystalline silicon thin film on an insulating substrate;

forming a second thin film on the first thin film;

forming a mask pattern by etching the second thin film; and doping a dopant ion into the first thin film through the mask pattern;

wherein the mask pattern forming process and the ion doping process are carried out continuously without exposing the insulating substrate to the atmosphere.

2. A method of manufacturing a semiconductor device according to claim 1, wherein the step of forming a mask pattern and the step of ion doping are carried out within the same chamber by changing a reaction gas.

3. A method of manufacturing a semiconductor device according to claim 2, wherein each of the step of forming a mask pattern and the step of ion doping includes a step of generating plasma in the chamber, and a step of drawing an ion or a radical of the reaction gas generated by the plasma generating step onto the insulating substrate based on a potential difference generated on the insulating substrate.

4. A method of manufacturing a semiconductor device according to claim 3, wherein the reaction gas used in the step of ion doping includes phosphor or boron.

5. A method of manufacturing a semiconductor device according to claim 3, wherein the potential difference generated on the insulating substrate is generated based on a self-bias.

6. A method of manufacturing a semiconductor device according to claim 5, wherein the self-bias is adjusted by controlling a voltage or a frequency which is applied from a high-frequency source to the insulating substrate.

7. A method of manufacturing a semiconductor device, comprising the steps of:

forming an non-single crystalline silicon thin film on an insulating substrate;

patterning the non-single crystalline thin film based on a mask pattern disposed on the non-single crystalline thin film; and doping a dopant ion into the non-single crystalline thin film, wherein the step of patterning and the step of ion doping are carried out continuously without exposing the insulating substrate to the atmosphere.

8. A method of manufacturing a semiconductor device according to claim 7, wherein the step of forming a mask pattern and the step of ion doping are carried out within the same chamber by changing a reaction gas.

9. A method of manufacturing a semiconductor device according to claim 8, wherein each of the step of forming a mask pattern and the step of ion doping includes a step of generating plasma, and a step of drawing an ion or a radical of the reaction gas generated by the plasma generating step onto the insulating substrate based on a potential difference generated on the insulating substrate.

10. A method of manufacturing a semiconductor device according to claim 9, wherein the potential difference generated on the insulating substrate is generated based on a self-bias.

11. A method of manufacturing a semiconductor device according to claim 10, wherein the self-bias is adjusted by controlling a voltage or a frequency to be applied from a high-frequency source to the insulating substrate.

12. A method of manufacturing a semiconductor device according to claim 7, wherein the step of ion doping includes determining a dopant ion density of a channel region of a thin-film transistor.

13. A method of manufacturing a semiconductor device, comprising the steps of:

forming a first thin film consisting of an non-single crystalline silicon thin film on an insulating substrate;

forming a second thin film on the first thin film;

forming a resist pattern on the second thin film;

forming a mask pattern by etching the second thin film based on the resist pattern; and doping a dopant ion into the first thin film through the mask pattern;

removing the resist pattern after the step of forming a mask pattern or after the step of ion doping, wherein the step of forming a mask pattern, the step of ion doping and the step of removing the resist pattern are carried out continuously without exposing the insulating substrate to the atmosphere.

14. A method of manufacturing a semiconductor device, comprising the steps of:

forming a first thin film consisting of an non-single crystalline silicon thin film on an insulating substrate;

forming a second thin film on the first thin film;

forming a first mask pattern by etching the second thin film;

forming a source region and a drain region by doping a dopant ion into the first thin film through the first mask pattern;

forming a second mask pattern by side-etching the first mask pattern following the ion doping process; and forming a light doped region with lower dopant ion density than that of the source region and the drain region, by doping a dopant ion into the first thin film through the second mask pattern, wherein the steps of forming the first and second mask patterns, the step of forming the source and drain regions and the step of forming the light doped region are carried out continuously without exposing the insulating substrate to the atmosphere.

15. A method of manufacturing a semiconductor device, comprising the steps of:

forming a first thin film consisting of an amorphous silicon film on an insulating substrate;

forming a second thin film on the first thin film; forming a mask pattern by etching the second thin film; and forming an ohmic contact region by doping a dopant ion into the first thin film through the mask pattern, wherein the step of forming a mask pattern and the step of ion doping are carried out continuously without exposing the insulating substrate to the atmosphere.

16. A method of manufacturing a semiconductor device, comprising the steps of:

forming a first thin film consisting of an amorphous silicon film on an insulating substrate;

forming a second thin film on the first thin film;

forming a resist pattern on the second thin film;

forming a mask pattern by etching the second thin film based on the resist pattern;

forming an ohmic contact region by doping a dopant ion into the first thin film through the mask pattern; and removing the resist pattern after the step of forming a mask pattern or after the step of ion doping, wherein the step of forming a mask pattern, the step of ion doping and the step of removing are carried out continuously without exposing the insulating substrate to the atmosphere.

17. A method of manufacturing a semiconductor device, comprising the steps of:

forming a gate electrode on an insulating substrate;

depositing a gate insulating film on the gate electrode;

depositing a first thin film consisting of an amorphous silicon thin film on the gate insulating film;

depositing a second thin film on the first thin film;

forming a resist pattern corresponding to the gate electrode on the second thin film;

forming a mask pattern by etching the second thin film based on the resist pattern;

forming ohmic contact regions by doping a dopant ion into the first thin film through the mask pattern; and removing the resist pattern after the step of forming a mask pattern or after the step of ion doping, wherein the step of forming a mask pattern, the step of ion doping and the step of removing are carried out continuously without exposing the insulating substrate to the atmosphere.

18. A method of manufacturing a semiconductor device according to claim 17, further comprising the step of:

forming a source electrode and a drain electrode which are brought into contact with the respective ohmic contact regions, following the step of ion doping.

19. A method of manufacturing a semiconductor device, comprising the steps of:

arranging in a vacuum chamber, an insulating substrate on which a first thin film consisting of a non-single crystalline silicon film and a second thin film on the first thin film are formed;

supplying a first reaction gas into the vacuum chamber and applying a first voltage from a first power source to generate an ion or a radical of the first reaction gas;

applying a second voltage to the insulating substrate from a second power source to draw the ion or the radical of the first reaction gas onto the insulating substrate in accordance with a potential difference generated on the insulating substrate, thereby etching the second thin film to form a mask pattern; and after exhausting the first reaction gas from the vacuum chamber, supplying a second reaction gas into the vacuum chamber and applying a third voltage from the first power source to generate an ion or a radical of the second reaction gas; and applying a fourth voltage to the insulating substrate from the second power source to draw the ion or the radical of the second reaction gas onto the insulating substrate in accordance with a potential difference generated on the insulating substrate, thereby doping a dopant ion into the first thin film through the mask pattern.

* * * * *